United States Patent [19]

Baar

[11] Patent Number: 4,478,472

[45] Date of Patent: Oct. 23, 1984

[54] ELECTRICAL CONNECTOR

[75] Inventor: Louis S. Baar, Clark, N.J.

[73] Assignee: RCA Corporation, New York, N.Y.

[21] Appl. No.: 561,272

[22] Filed: Dec. 14, 1983

Related U.S. Application Data

[63] Continuation of Ser. No. 314,846, Oct. 26, 1981, abandoned.

[51] Int. Cl.$^3$ ........................................ H01R 13/639
[52] U.S. Cl. ............................ 339/75 M; 339/17 CF; 339/147 R
[58] Field of Search ............ 339/17 CF, 74 R, 75 M, 339/176 M, 147 R, 147 P

[56] References Cited

U.S. PATENT DOCUMENTS

| | | | |
|---|---|---|---|
| 3,539,973 | 11/1970 | Antes et al. | 339/143 |
| 3,621,157 | 11/1971 | Schwab | 339/17 CF |
| 3,716,820 | 2/1973 | Deakin | 339/147 P |
| 3,763,459 | 10/1973 | Millis | 339/75 |
| 3,854,107 | 12/1974 | Tuchto et al. | 339/79 |
| 3,880,493 | 4/1975 | Lockhart, Jr. | 339/147 R |
| 4,072,380 | 2/1978 | Freehauf | 339/17 CF |
| 4,113,341 | 9/1978 | Hughes | 339/147 R |
| 4,205,891 | 6/1980 | Rieman et al. | 339/126 R |
| 4,212,510 | 7/1980 | Ritchie et al. | 339/147 R |
| 4,326,765 | 4/1982 | Brancaleone | 339/147 R |
| 4,362,347 | 12/1982 | Berglund et al. | 339/147 R |

FOREIGN PATENT DOCUMENTS 2215152 10/1973 Fed. Rep. of Germany ... 339/147 R

OTHER PUBLICATIONS

"Integrated-Circuit Sockets Have Integral Decoupling Capacitors", *Electronics,* Sep. 22, 1981, pp. 208, 210.

*Primary Examiner*—John McQuade
*Attorney, Agent, or Firm*—Joseph S. Tripoli; George E. Haas; William Squire

[57] ABSTRACT

A connector receptive of a package such as a dual in-line package (DIP), which it is desired to test, is connected to a printed circuit board. The housing of the connector is formed with a cavity in communication with the contacts of the connector so that high frequency filter components may be inserted within the housing closely adjacent selected ones of the contacts for conducting to system ground undesired AC signals. Such signals sometimes are produced in response to the presence of the impedance created by the distributed inductance of the contacts between the circuit under test and ground and also may be due to the coupling of AC signals by the distributed capacitances among the contacts.

4 Claims, 16 Drawing Figures

ELECTRICAL CONNECTOR

This is a continuation of application Ser. No. 314,846 filed Oct. 26, 1981 now abandoned.

The present invention relates to electrical connectors for connecting semiconductor devices to printed circuit boards, and more particularly, to connectors which have provision for receiving components.

Some forms of electrical connectors are employed as sockets for connecting electrical elements to printed circuit boards. Such an element may be a printed circuit, or a semiconductor device mounted in a housing, as examples. A typical housing may comprise a so-called dual in-line package (DIP)—a housing with two rows of leads extending therefrom. An electrical connector may be employed to provide a permanent or a temporary connection between the DIP and a printed circuit board.

A temporary connection may be used when testing and evaluating electrical elements. A connector socket suitable for this use is described in U.S. Pat. No. 3,763,459, issued to Edwin G. Millis. It has biased electrical contacts for reducing pressure on the leads of a package when it is inserted into the connector, which is known generally as a low insertion force connector. When the package is in place, the connector contacts are resiliently engaged with the leads of the package.

The patented socket connector, as well as electrical connectors which do not have reduced insertion force mechanisms, sometimes are used in the test of high frequency, high gain semiconductors. In such use they are not entirely satisfactory. When operated in a high frequency range, for example, 3–10 MHz, and at high gain, for example, 70–80 dB gain, there is the potential for feedback between the inputs and outputs of the device being tested. The feedback is the result of inductance in the electrical connector contacts and capacitance between adjacent connector contacts due to the relatively long distance (of the order of ⅜ inch in some cases) between the device housing and the printed circuit board. Undesired AC voltages develop across these parasitic or distributed reactive elements which adversely affect the performance of the device under test so that test results may be erroneous and not indicative of the packaged device performance in its end use (where intervening connectors are not used).

An electrical connector in accordance with the present invention comprises an electrically insulating housing including first and second facing contiguous releasable members. The members have a component receiving cavity in at least one member at the interface of the members and enveloped by both of the members. An array of spaced electrically conductive terminals each having a first end and a second end opposite the first end are in the housing. One terminal end is adapted to receive a first electrical conductor at an outer face of one of the members, and the other terminal end is adapted to receive a second electrical conductor at an outer face of the other of the members on a side of the housing opposite the one member outer face. Each of the terminals has a portion adjacent the cavity and adapted to be selectively connected to a lead of a component entirely within the cavity. The terminals of the array are spaced in a given direction with the terminal leads extending in a direction generally normal to that given direction.

In the drawing:

FIG. 1 is an isometric view of a connector embodying the present invention in place in a printed circuit board and with a DIP plugged in;

Figure 1:
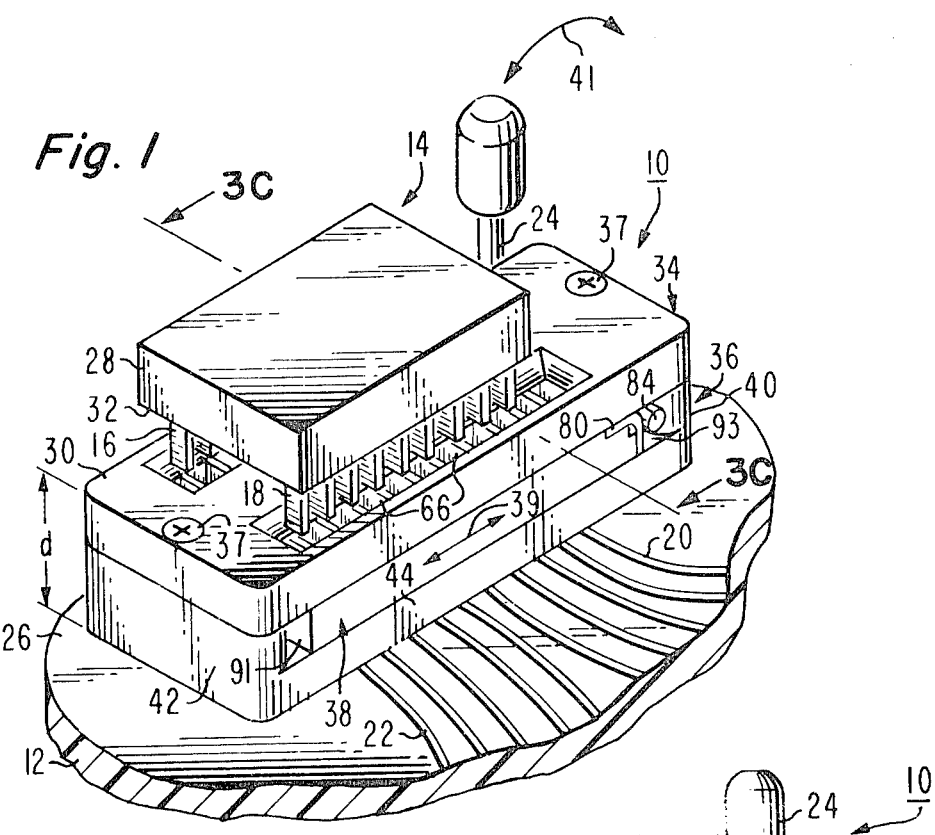
Figure 2:
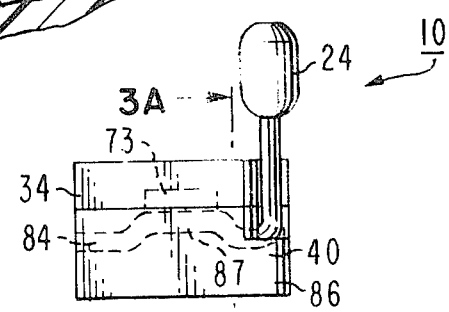
FIG. 2 is an end elevation view of the connector of FIG. 1.

In FIG. 1, connector 10, secured to printed circuit board 12, connects integrated semiconductor device 14 to conductors 20, 22 on the board 12. The device 14 is a dual in-line package (DIP) having two parallel rows of leads 16 and 18. Connector 10 has a plurality of contact elements for respectively electrically connecting the leads 16, 18 to one or more of corresponding different conductors 20, 22 and so forth on the printed circuit board 12, the conductors being connected to a DIP device test apparatus (not shown). The contact elements of the connector 10 are connected to the conductors 20, 22, e.g., by soldering, to complete the circuit. The connector 10 preferably is of the zero insertion force type whose contact elements are movable to provide different contact forces on the leads 16, 18. This permits the device 14 to be inserted into the socket of connector 10 with relatively low force. Thereafter, the contact elements are cammed into contact with the leads 16, 18 by cam lever 24. Connector 10 may be of the type described in the aforementioned U.S. Pat. No. 3,763,459, the present invention being an improvement over the socket described in that patent. The present invention while disclosed as being employed with a zero insertion force connector, however, is not limited to such a connector and may be also employed with connectors of the fixed contact type.

In FIG. 1, connector 10 is spaced slightly above the upper surface 26 of printed circuit board 12 via projections 13 (FIG. 7) on the connector housing. The body 28 of device 14, when leads 16, 18 are inserted into the socket of connector 10, is substantially flush with the upper surface 30 of the connector 10 housing. The body 28 undersurface 32 is spaced from the printed circuit board surface 26 a distance d. Distance d can be approximately ⅜ inch or greater in accordance with the construction of a given connector. When a device 14 is of the high frequency type, as described above in the introductory portion of this application, parasitic inductances which may be present on one or more of the leads 16, 18, may effect the operation of device 14 as will be explained later. These inductances may also appear on the corresponding contact elements of the connector 10. The inductances create undesirable feedback or other effects in the circuit of the device 14. Because the device 14 is closely mounted to connector 10 and the connector 10 is closely mounted to the printed circuit board 12, it has not been heretofore possible to effectively deal with the inductances in the leads 16, 18 and of the contact elements of the connector 10. The connector 10 being of the low insertion force type while extremely suitable for test and evaluation of a large number of semiconductor devices 14, does not lend itself to readily resolve the inductance problem discussed, because of its relatively complex structure.

A connector constructed in accordance with the present invention, as will now be described, includes provisions for mounting components very close to the leads 16 and 18 in the connector 10 to conduct to a reference potential, e.g., system ground, undesirable signals due to the undesirable parasitic inductances appearing at at least one of the leads and capacitances present between adjacent contact elements.

The inductances present on the various leads form impedances. Certain of these leads, which may be at ground potential, are coupled to both an input and output of the device 14. The parasitic inductances create an AC voltage by forming an impedance between the device circuit and ground or by capacitive coupling an AC voltage to a given lead from other adjacent leads. This AC voltage in combination with other components in the device 14 circuit can result in regenerative feedback and, in some cases, oscillations. In any case, the AC voltages so created affect the device 14 performance in an adverse way. These problems appear when the device is tested due to the test connector employed to connect the device 14 to its test circuit.

When the device 14 is in its end use environment it is secured directly to the conductors of a printed circuit board such as by soldering. Undesirable signals in the device leads can be conducted to ground in that case by connecting filtering components, such as a capacitor, to ground close to the device 14, such as by connecting the filtering components to the printed circuit board conductors. Such filtering components, when a test connector is used due to their relative distance from the device 14 circuit, are of no help in dealing with impedances created by the test connector which interfaces device 14 with a test circuit.

In FIG. 1, connector 10 has an electrically insulating housing formed of three thermoplastic members 34, 36, and 38 which may be molded. Member 38 can be moved in directions 39 by operation of cam lever 24 when pivoted in directions 41. Member 34 is screwed to member 36 by screws 37. Members 34 and 38 are planar structures. Member 36 has a planar base 44 and two legs 40 and 42 parallel to each other at opposite ends of the base 44. Member 34 is secured to the upper surfaces of the legs 40 and 42 as shown. The member 38 slidable, but snugly, fits in the space between the members 34 and 38.

Figure 6:
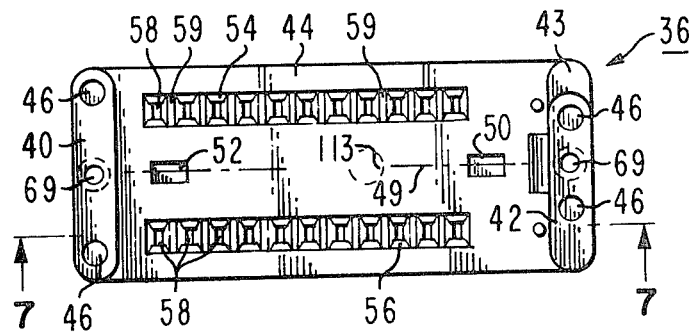
FIG. 6 is a plan view of a second housing member of the connector embodiment of FIG. 2.
Figure 7:
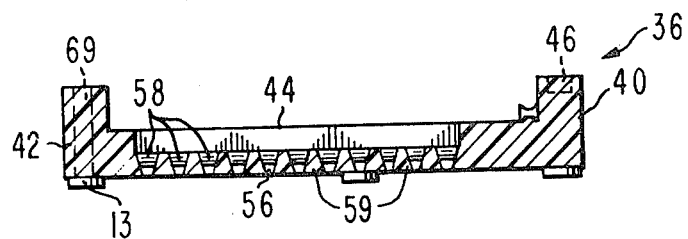
FIG. 7 is a sectional elevation view through the embodiment of FIG. 6 taken along lines 7—7.

In FIGS. 6 and 7, member 36 includes locating recesses 46 in the end surfaces of the legs 42 and 40. Hole 69 in legs 40 and 42 receives the screws 37, FIG. 1. Base 44 has two slots or recesses 50 and 52 aligned along the base longitudinal axis 49 from left to right of the drawing. Two arrays 54 and 56 of like holes 58 are in the base 44. The holes 58 are shaped to receive contact elements 90, FIGS. 10A and 10B, to be described later. The arrays 54 and 56 are in two parallel rows extending the length of the base 44 parallel to axis 49. Adjacent apertures 58 are separated by a bridging wall 59. Leg 42 has a notch 43 at one end for receiving the rotating cam lever 24, FIG. 1.

Figure 4:
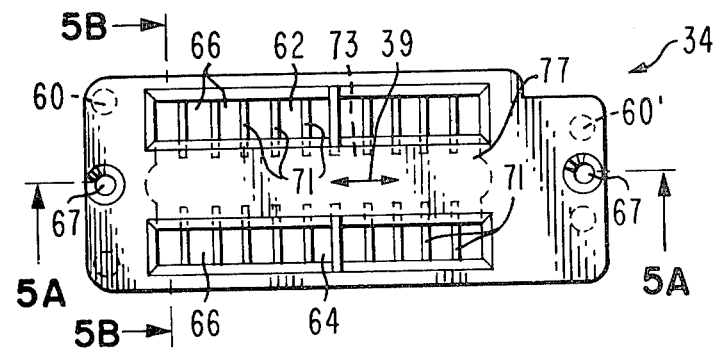
FIG. 4 is a plan view of one housing member of the embodiment of FIG. 2.
Figures 5A, 5B:
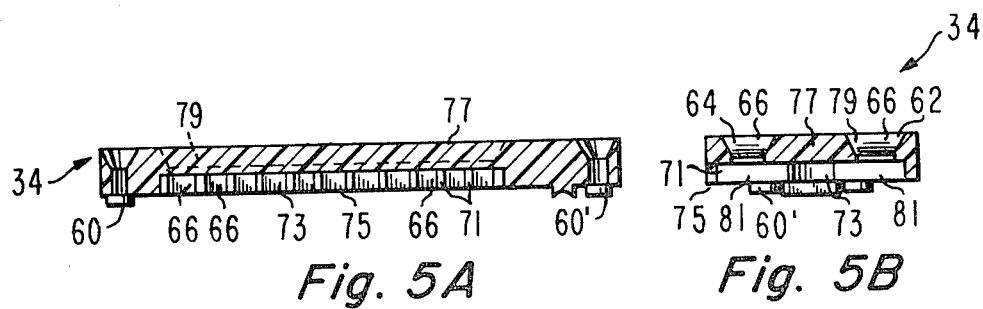
FIG. 5A is a side sectional elevational view of the member of FIG. 4 taken along lines 5A—5A.
FIG. 5B is an end sectional view of the embodiment of FIG. 4 taken along lines 5B—5B.

In FIGS. 4, 5A, and 5B, upper member 34 has two parallel arrays 62, 64 of holes 66 of the same shape extending the length of the member 34. Four projections 60 depend from the lower surface 75 of member 34 and are closely received in corresponding recesses 46 in member 36, FIG. 6. The recesses 46 and projections 60 align the rows 62 and 64 of holes 66 with the respective rows 54 and 56 of holes 58 of the members 34 and 36, FIGS. 4 and 6. There is one hole 66 in the member 34 for each hole 58 in the member 36. The holes 66 of member 34, FIG. 4, are shaped to receive the contact elements 90, FIGS. 10A and 10B, to be described. The holes 66 of member 34 are separated by bridging walls 71. Walls 71 are aligned directly above the walls 59 of member 36. The spacing of holes 66 to holes 58 is fixed.

Member 34 has an elongated cavity 73 formed between the arrays 62 and 64. The cavity 73 is formed in the undersurface 75, FIG. 5A, of the member 34 and is relatively close to the device 14 for reasons to be explained. The cavity 73 is directly beneath the central region 77 of the member 34. The holes 66, FIG. 5B, each comprise an open elongated channel 79 and a separate slot 81 beneath the channel 79. The slots 81 are separated by the walls 71, FIG. 4. Each slot 81 is open to the cavity 73 in a direction normal to directions 39.

Figure 8:
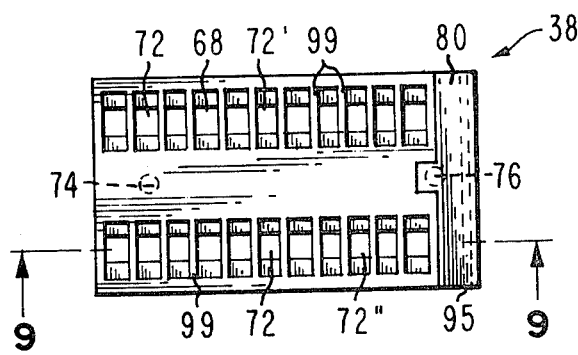
FIG. 8 is a plan view of a third housing member of the embodiment of FIG. 2.
Figure 9:
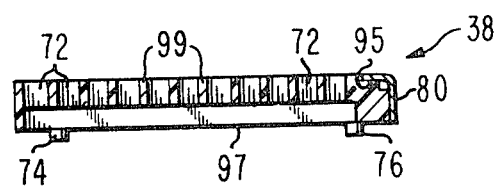
FIG. 9 is a sectional elevation view of the member of FIG. 8 taken along lines 9—9.

In FIGS. 8 and 9, intermediate member 38 which is reciprocable in directions 39, FIG. 1, includes two arrays 72' and 72" of holes 72. The holes 72 are of the same shape. Each hole 72 corresponds to a hole 66 in member 34 and a hole 58 in member 36. The length dimension of the member 38 along axis 49, FIG. 6, is smaller than the inside dimension between the walls 40 and 42 of member 36, FIGS. 6 and 7. This difference in length produces a gap 91, FIG. 3A, between member 38 and wall 42 and a gap 93 between member 38 and wall 40. Member 38 is formed with a shoulder 95 at one end, FIG. 9, over which is a metal angle 80. Angle 80 serves as a durable camming surface for the camming lever 24, FIG. 3A. Projections 74 and 76, FIG. 9, depend from the undersurface 97 of the member 38 and are received within the slots 52 and 50, respectively, in the base 44, FIG. 6. The slots 50 and 52 and projections 74 and 76 permit reciprocating motion of the member 38 with respect to the members 34 and 36 only in the directions 39, FIG. 1. Holes 72 of the member 38, FIGS. 8 and 9, are separated by bridging walls 99 of like dimensions. All of the holes 66, 58, and 72 of the respective members 34, 36, and 38 and their bridging walls 71, 59, and 99 in each of the members are of like center-to-center dimensions in the directions 39, FIG. 1. The surfaces of the bridging walls 71, 59, and 99 of the various members are aligned one above another, flush in at least one position of the intermediate member 36, FIG. 3A.

Figure 3A:
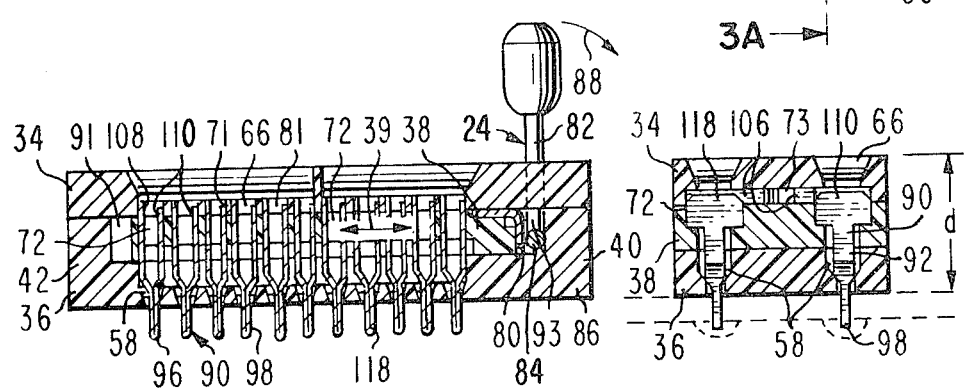
FIG. 3A is a sectional view taken along lines 3A—3A of the connector of FIG. 2.
Figures 10A, 10B, 11:
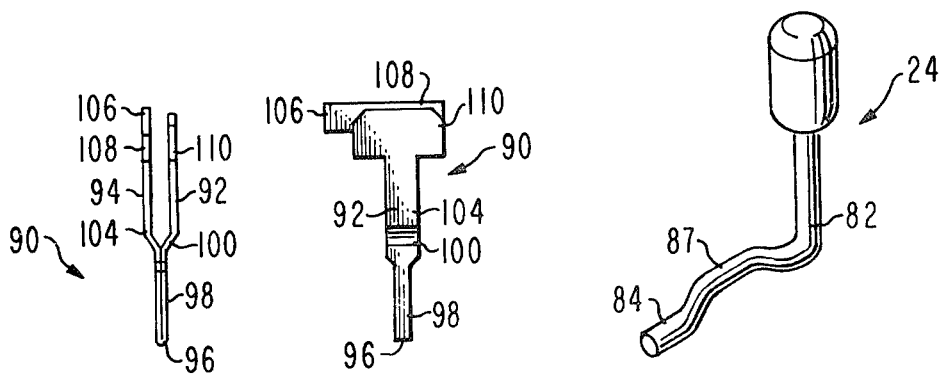
FIGS. 10A and 10B are respective end and side elevation views of a contact element employed in the connector of FIG. 1.
FIG. 11 is an isometric view of a cam lever employed in the embodiment of FIG. 2.

In FIG. 11, camming lever 24 includes two legs 82 and 84 bent at right angles. Leg 84 has a central cam bend 87. In FIG. 3A, the cam leg 84 is in gap 93 between member 38 and leg 40 of the member 36 and abuts angle 80. The leg 82 extends in a direction generally normal to directions 39 when leg 82 is upright. In this orientation, the cam 87, FIG. 11, sits above the line of leg 84 in the gap between the angle 80 and wall 40. When the lever 24 is rotated clockwise, FIG. 3A, in direction 88, the cam 87, FIG. 11, rotates 90° and cams the member 38 via angle 80 to the left of the drawing, FIG. 3A, closing the gap 91 at the left of the member 38.

In FIGS. 10A and 10B, the contact elements employed in the present embodiment may all be identical, however, this is not required, as will be explained. Contact elements 90 are generally Y-shaped in end section as shown in FIG. 10A. The stem 98 of the Y is formed with a relatively narrow portion, FIG. 10B, of sheet metal bent at 96. The metal then separates at 100 to form a Y configuration and is bent again to form two parallel upstanding legs 92 and 94. The legs 92 and 94 at 104 are wider than the stem 98, FIG. 10B. Legs 92 and 94, portions 104 then terminate in still wider upper portions at 108 and 110. The portion 108 has a tab 106 which is an extension of 108.

Figure 3C:
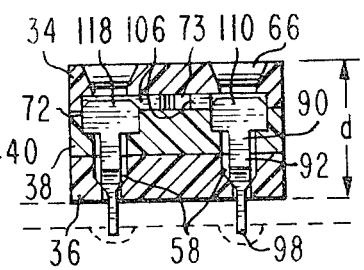
FIG. 3C is an end sectional view taken along lines 3C—3C of the embodiment of FIG. 1.
Figure 3B:
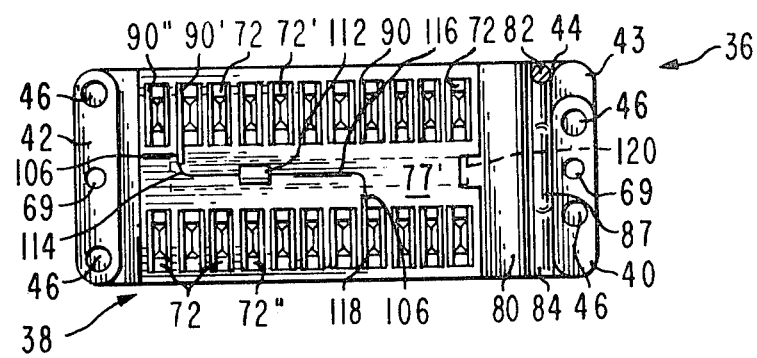
FIG. 3B is a plan view of the connector of FIG. 2 with the upper housing member, FIG. 4, removed.

Contact elements 90 are removably positioned within the aligned apertures, FIGS. 3A and 3C. Stem 98, Y 100, and part of 104, FIGS. 10A and 10B, are in the apertures 58 of member 36. Portions 104 extend into apertures 72 of member 38. The upper wider portions at 108 and 110, FIGS. 10A and 10B, are partially within the apertures 72 of member 38 and extend into apertures 66 of member 34. The apertures 66, 72, and 58 are shaped to receive closely the contact elements 90, FIG. 3C. In FIG. 3C, tabs 106 of the contact elements 90 extend in a direction toward the central cavity 73 in the upper member 34. In FIG. 3B, the contact element 90' has its tab 106 extending over the central region 77' of member 38 between the arrays 72', 72" of holes 72.

In the alternative, some of the contacts 90 need not have the tab 106, FIG. 10B. In this instance, the contacts may have their upper portions 108 and 110 of about the same size and of the same shape and size as the portion 110, as shown by contact 90''', FIG. 3B. In any case, the portion 108 whether or not it has the tab 106, is stationary when assembled in the housing whereas the portion 110 is movable by member 38. To facilitate movement of portion 110 so it does not interfere with the housing when moved, it may have its upper corners chamfered as shown in FIG. 10B.

In FIG. 3A, contact portions 108 abut the left walls in the drawing of the holes 66 and 72. Portion 110 abuts the right walls of the same corresponding holes. The contact elements 90 are formed of resilient sheet material such as beryllium copper or the like and once formed into the shape of FIGS. 10A and 10B, tend to retain that shape. The legs 92 or 94 are resilient so that, when deformed, they tend to return to the original configuration shown in, FIG. 10A. With the contact legs upright and parallel, FIGS. 10A and 3A, the intermediate member 38 is positioned to the right in directions 39 in the drawing. The contacts force the member 38 and thus metal angle 80 against the cam lever 24 positioning the cam 87 of lever 24 upright in FIG. 3A toward the top of the drawing. In this case, the gap 93 is the smallest and the gap 91 to the left of member 38 in the drawing is the greatest in directions 39. Rotation of the cam 24 to the right in direction 88, FIG. 3A, moves the member 38 to the left of the drawing, FIG. 3A, causing the contact portion 110 to move toward and engage the contact portions 108 of the same contact elements. This provides the so-called zero insertion force connector structure which permits the leads 16 and 18, FIG. 1, of the device 14 to be inserted with a minimal force between the contact portions 108 and 110 of elements 90 when oriented in the spaced configuration shown in FIG. 3A. At this point the resistance of the contacts to the sliding action of the leads being inserted is a minimum. Once the device 14 leads are inserted between portions 108 and 110, the cam lever 24, FIG. 3A, is rotated in direction 88, forcing the contacts into conductive engagement with the leads 16 and 18. All of this action is described in the aforementioned U.S. Pat. No. 3,763,459 which describes a version of the connector described herein and is incorporated by reference herein.

As discussed above, the length of the contact elements 90, FIGS. 3A and 3C is such that an inductance is inherently present of a value dependent on the length of the contact element 90. There also may be capacitive coupling between adjacent contact elements which coupling may cause undesirable electrical feedback when the device 14 is connected to the remainder of the circuit mounted on the printed circuit board 12, forming with the circuit on the board a critical circuit when coupled to a high gain, high frequency amplifier formed by the test device 14.

To overcome and filter out these undesirable effects, a component such as a capacitor 112, FIG. 3B, is inserted in the cavity 73 above the mid-region 77', of member 38. Lead 114 of the component 112 is connected to tab 106 of contact element 90', the tab 106 being stationary. The other lead 116 of the component 112 is connected to the tab 106 of contact element 118. Only one component 112 which is capacitive, is included by way of example. In some cases the component may also be resistive, or in other cases a number of capacitive components may be employed as will be shown.

The device under test may have a particular circuit in which one lead to be inserted into conductive contact with the contact element 118, FIG. 3B, which is a plan view of the connector 10 with the upper member 34 removed, has a ground or reference potential thereon. The contact element 90' may be connected to that part of the circuit of device 14 which requires that any signal currents, i.e., an AC voltage created by the parasitic inductance between the device 14 circuit and system ground or an AC voltage coupled to that lead by a capacitance between adjacent leads, appearing at that point should be bypassed, i.e., conducted to the reference potential of device 14. Normally the bypassing element, such as component 112, is connected at the lower surface of the printed circuit board 12 opposite the surface to which connector 10 is secured. The lead inductance formed by contact elements 90' and 118, however, represent an undesirable impedance common to the input and output circuits of the device 14 and create the undesirable effects noted above. With the component 112 located as shown in FIG. 3B, assuming, for example, that it is a lumped capacitor element which operates as a low impedance bypass path (a filter) for the high frequency signal currents, the component 112 conducts the undesirable signals on a contact element such as element 90' to system ground. Further, because of its location, i.e., relatively close to surface 30 of member 34 and thus close to device 14, the undesired AC voltage or other effects of the connector lead inductance tend to be eliminated or at least substantially reduced, thereby permitting operation of the circuit being tested (the one within the DIP) more nearly as if the connector and its inherent inductance did not exist. Inductances of other contact elements connected to other of the device 14 leads may have no effect on the performance of the device 14. However, if inductances on other elements are also critical, other similar filtering components may be inserted within the cavity 73 limited only by the space available.

In FIG. 3B, the contact portion 106 of element 90' extends into the region 77' for the purpose of facilitating connecting the contact portion 106 to the lead 114. The remaining contact elements have their contact portions, such as 106, flush with the edge of their corresponding holes and therefore do not make an undesirable connection to one of the component 112 leads 114, 116. All of the contact elements are manually releasably inserted into their corresponding holes and can be readily removed. Those contact elements to which it is desired to connect a filter component, such as component 112, and having a tab 106, are selectively placed into the desired set of aligned holes of the connector which receive the particular lead or leads of the device 14 to be grounded. In FIG. 3B, only two contact elements 90' and 118 are shown with a tab 106, the remaining contact elements have no tab 106. It is readily apparent that this placement is in accordance with a given implementation. However, it should also be understood that it is not required that the contact elements have a contact tab 106 for connection to a component. The contact tab 106 facilitates such a connection.

Figure 12:
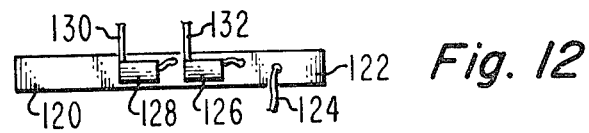
FIG. 12 is a plan view of a component bus conductor employed in one embodiment of the present invention.

When it is desired to connect a number of components such as component 112 in one connector assembly, then such components may be connected to a common ground terminal such as a bus conductor. In FIG. 12, a copper strip 120 is coated with a lead tin layer 122. A conductor lead 124 is soldered to the bus conductor at an appropriate location to be aligned with a contact portion 106 of one of the contact elements 90 of the connector to which the bus is to be connected. A number of components such as capacitors 126 and 128 have one lead thereof soldered to the bus layer 122. The other component leads 130 and 132 extend from the respective capacitors 128 and 126 in a direction to be readily connected to the contact tabs 106 of the corresponding contact elements to which they are to be secured. The bus assembly of FIG. 12 is then inserted in the region 77' above member 38, FIG. 3B. The leads 130, 132 are connected to the corresponding contact tab 106 and the lead 124 is connected to its corresponding contact tab 106. The bus is thus secured in place by these connections. Cover member 34 is then screwed in place as shown in FIG. 1. The components 126 and 128 and the bus 120 are all contained within the cavity 73, FIGS. 4, 5A, and 5B, and are sufficiently close to the device 14 adjacent its leads to alleviate the parasitic inductance problem discussed. The bus is sufficiently narrow with respect to the region 77', FIG. 3B, so as to be electrically isolated from all of the contacts except those to which it is to be attached.

As described above, the implementation of the cavity 73, FIG. 4, in the present embodiment is shown in connection with a zero insertion force connector. It will be equally apparent that a zero insertion force connector is not essential to the present invention. That is, a connector comprising an upper and lower member, such as members 34 and 36 in which the members 38 and 36 comprise a single integral structure rather than two separate members, may be provided. In this case a cavity may be provided in either the upper member 34 or the lower member in the central region such as region 77, FIG. 4. Preferably, the cavity should be in the upper member 34 so bypass components in the cavity may be positioned as close as possible to the upper surface such as surface 30, FIG. 1, of the connector. It is preferable in this implementation that the contact elements also be selectably removable but that too is not essential. When it is desired to connect the respective components to selected ones of the contact elements, the components are placed in the cavity and connected to the particular contact elements as described. The present implementation in a zero insertion force connector is a difficult environment for the placement of filtering components due to the mechanical relationship of the various elements of the connector. What is important is that the filtering components may be inserted within the envelope of the connector housing so as to be next adjacent the contact elements and as close as possible to the leads of the device 14 under test where these leads protrude from the device body 28.

What is claimed is:
1. An electrical connector comprising:
an electrically insulating housing including first and second facing contiguous releasable members, said members having a component receiving cavity in at least one of said members at the interface of said members and enveloped by both said members;
an array of spaced electrically conductive terminals each having a first end and a second end opposite the first end, one end being adapted to be connected to a first electrical connector at an outer face of one of said members, the other terminal end being adapted to be connected to a second electrical conductor at an outer face of the other of said members on a side of the housing opposite said one member outer face, each said terminals having a portion adjacent said cavity and adapted to be selectively connected to a lead of a component within said cavity, the terminals of said array being spaced in a given direction, said terminal ends extending in a direction generally normal to said given direction;
said terminals including a pair of spaced elements at least one of which is movable in said given direction, said housing including a third electrically insulating member fixed to one of the first and second members, the other of said first and second members being movably secured between the third and the one member for movement in a direction parallel to said given direction, said terminal one movable element being engaged with said other of said first and second members and movable in said parallel direction, and actuating means secured to said housing for selectively moving said other of said first and second members and said movable element in a direction at least toward said other element of said pair; and
a bus conductor in said cavity extending in said given direction electrically isolated from said terminals and adapted to be selectively attached to at least one lead of any one of a plurality of components and any one of said terminals in said cavity, said bus conductor being secured in said cavity by its attachment to said one component and said one terminal.

2. An electrical connector comprising:
an electrically insulating housing having a pair of spaced walls;

an electrically insulating housing member in said housing and slidably secured between said spaced walls for movement in a given direction;

an array of electrically conductive terminals passing through said member, each terminal having opposite ends thereof in communication with respective surfaces of said spaced walls on opposite sides of the housing, said terminals each including at least one movable terminal contact which moves in said direction in response to the movement of said member;

said walls and member forming a component receiving cavity between at least one of said walls and said member and open to at least a portion of said terminals;

means secured to said housing for moving said member in a direction parallel to said direction to selectively move said terminal contact;

said terminals comprising resilient material having an integral terminal contact at one end and a pair of resilient facing terminal contacts at the other end, at least one of said resilient facing contacts comprises said movable contact, one wall of said insulating housing including means engaged with said movable contact for selectively causing said movable contact to engage and disengage a conductor inserted between said pair of contacts; and a bus conductor in said cavity passing adjacent said portion of terminals electrically isolated therefrom and adapted to be selectively electrically connected to any of said adjacent terminals.

3. The connector of claim 2 further including at least one electrical component in said cavity having one lead thereof connected to one of said terminals and a second lead connected to another of said terminals.

4. In a connector including an insulating housing for making a disengagable connection between leads on a semiconductor device and electrical conductors secured in the housing each having resilient legs connected at one end, a contact element on each of said legs, and actuating means secured to the housing adapted to exert a force in a given direction on at least one leg of each conductor for deflecting the one leg into engagement with a device lead inserted between the contact elements of the conductor, deflecting the one leg in the direction of said force, the improvement comprising, a component receiving cavity enveloped by said housing in communication with at least one contact element of each conductor and a bus conductor element in said cavity passing adjacent a plurality of said electrical conductors and fixed in spaced relation to said conductors adapted for electrical connection to selected ones of said conductors.

* * * * *